(12) United States Patent
Todoroki

(10) Patent No.: US 6,697,442 B1
(45) Date of Patent: Feb. 24, 2004

(54) VITERBI DECODING APPARATUS CAPABLE OF SHORTENING A DECODING PROCESS TIME DURATION

(75) Inventor: Toshiya Todoroki, Tokyo (JP)

(73) Assignee: NEC Corporation, Tokyo (JP)

( * ) Notice: Subject to any disclaimer, the term of this patent is extended or adjusted under 35 U.S.C. 154(b) by 602 days.

(21) Appl. No.: 09/594,124

(22) Filed: Jun. 14, 2000

(30) Foreign Application Priority Data

Jun. 15, 1999 (JP) .......................................... 11-168840

(51) Int. Cl.⁷ ............................................. H04L 27/06
(52) U.S. Cl. ...................... 375/341; 375/262; 714/795; 714/796
(58) Field of Search ................................ 375/341, 262; 714/795, 796

(56) References Cited

U.S. PATENT DOCUMENTS

| | | | | |
|---|---|---|---|---|
| 4,777,636 A | * | 10/1988 | Yamashita et al. | 714/795 |
| 4,905,317 A | * | 2/1990 | Suzuki et al. | 714/795 |
| 5,509,021 A | * | 4/1996 | Todoroki | 714/795 |
| 6,041,433 A | * | 3/2000 | Kamada | 714/795 |
| 6,141,384 A | * | 10/2000 | Wittig et al. | 375/265 |
| 6,408,420 B1 | * | 6/2002 | Todoroki | 714/795 |

FOREIGN PATENT DOCUMENTS

| JP | 03-179925 | 8/1991 |
|---|---|---|
| JP | 9-191258 | 7/1997 |
| JP | 10-056389 | 2/1998 |
| JP | 10-215190 | 8/1998 |
| JP | 11-074800 | 3/1999 |
| JP | 2996615 | 10/1999 |

OTHER PUBLICATIONS

Japanese Office Action, dated Oct. 3, 2001, with English language translation of Japanese Examiner's comments.
Forney, G. D., "The Viterbi Algorithm," *Proceedings of the IEEE*, vol. 61, No. 3, Mar. 1973, pp. 268–278.

* cited by examiner

Primary Examiner—Temesghen Ghebretinsae
(74) Attorney, Agent, or Firm—Whitham, Curtis & Christofferson, P.C.

(57) ABSTRACT

By using a branch metric and a path metric which are produced from received data every symbol time, an ACS circuit 13 produces a path-selecting information while renewing the path metric by adding the branch metric entering the state to path metric of the connecting survivor for all the paths entering a state in accordance with Viterbi algorithm. The path-selecting information is sequentially stored in each of path memory blocks. The path memory blocks are connected to one another so that a result of the trace-back may become a starting point for starting the trace-back of a next path memory block when trace-back is made. The trace-back is started from a selected one of the path memory blocks having a state number obtained by a maximum path state number detector. An output of the selected path memory block is output via a selector as decoded data.

5 Claims, 7 Drawing Sheets

SOFT-DECISION DATA

| | 1 1 1 |
|---|---|
| | 1 1 0 |
| 0 | 1 0 1 |
| | 1 0 0 |
| | 0 1 1 |
| | 0 1 0 |
| 1 | 0 0 1 |
| | 0 0 0 |

FIG.8

ADDRESS

| | |
|---|---|
| 0 | PATH SELECTING INFORMATION AT m1 TIME |
| 1 | PATH SELECTING INFORMATION AT m2 TIME |
| 2 | PATH SELECTING INFORMATION AT m3 TIME |
| | ⋮ |
| 9 | PATH SELECTING INFORMATION AT m10 TIME |
| 10 | PATH SELECTING INFORMATION AT m11 TIME |
| 11 | PATH SELECTING INFORMATION AT m12 TIME |
| | ⋮ |

FIG.9

VITERBI DECODING APPARATUS CAPABLE OF SHORTENING A DECODING PROCESS TIME DURATION

BACKGROUND OF THE INVENTION

The present invention relates to a Viterbi decoding apparatus.

As an error-correcting method of performing error correction in the digital transmission of data, there is known, for example, a Viterbi decoding algorithm (G. D. Forney. Jr., "The Viterbi algorithm" Proceeding of IEEE, vol. 61, pp 268–278, Mar. 1973).

In a conventional Viterbi decoding apparatus, as will be described later, the operation of tracing the path memory back to the past every symbol time is performed. As a result, the trace-back operation needs a larger amount of time therefore. Therefore, the apparatus has the problem that the decoding period of time becomes resultantly long.

SUMMARY OF THE INVENTION

An object of the invention is to provide a Viterbi decoding apparatus capable of shortening a decoding process time duration.

According to this invention, there is provided a Viterbi decoding apparatus for processing received P data and received Q data by a trace-back method to obtain decoded data. The received P data and the received Q data are obtained by carrying out convolutional coding of data which are received by the receiver. The Viterbi decoding apparatus comprises branch metric producing means for producing a branch metric in accordance with the received P data and the received Q data, path metric register means for registering a cumulative metric of survivor paths, Add Compare Select (ACS) circuit means for adding said branch metric entering that state to said cumulative metric of the connecting survivor for all the paths entering a state, comparing, selecting the largest metric for each state (in the case constraint length equals to K, the number of the states is the K–1)th power of 2), outputting path-selecting information of each state every symbol time, and storing the selecting metric for each state as the cumulative metric (path metric) of the next preceding time unit, maximum path state number detector means for getting the state number to check the largest path metric among said the states, a plurality of path memory blocks for storeing the path-selecting information of each state every symbol time, the path memory blocks being connected to one another so that a result of trace-back may become a starting point for starting said trace-back of a next path memory block when the trace-back is made, and selector means for selecting outputs of the path memory blocks to produce the decoded data.

DESCRIPTION OF THE PREFERRED EMBODIMENT

Figure 1:
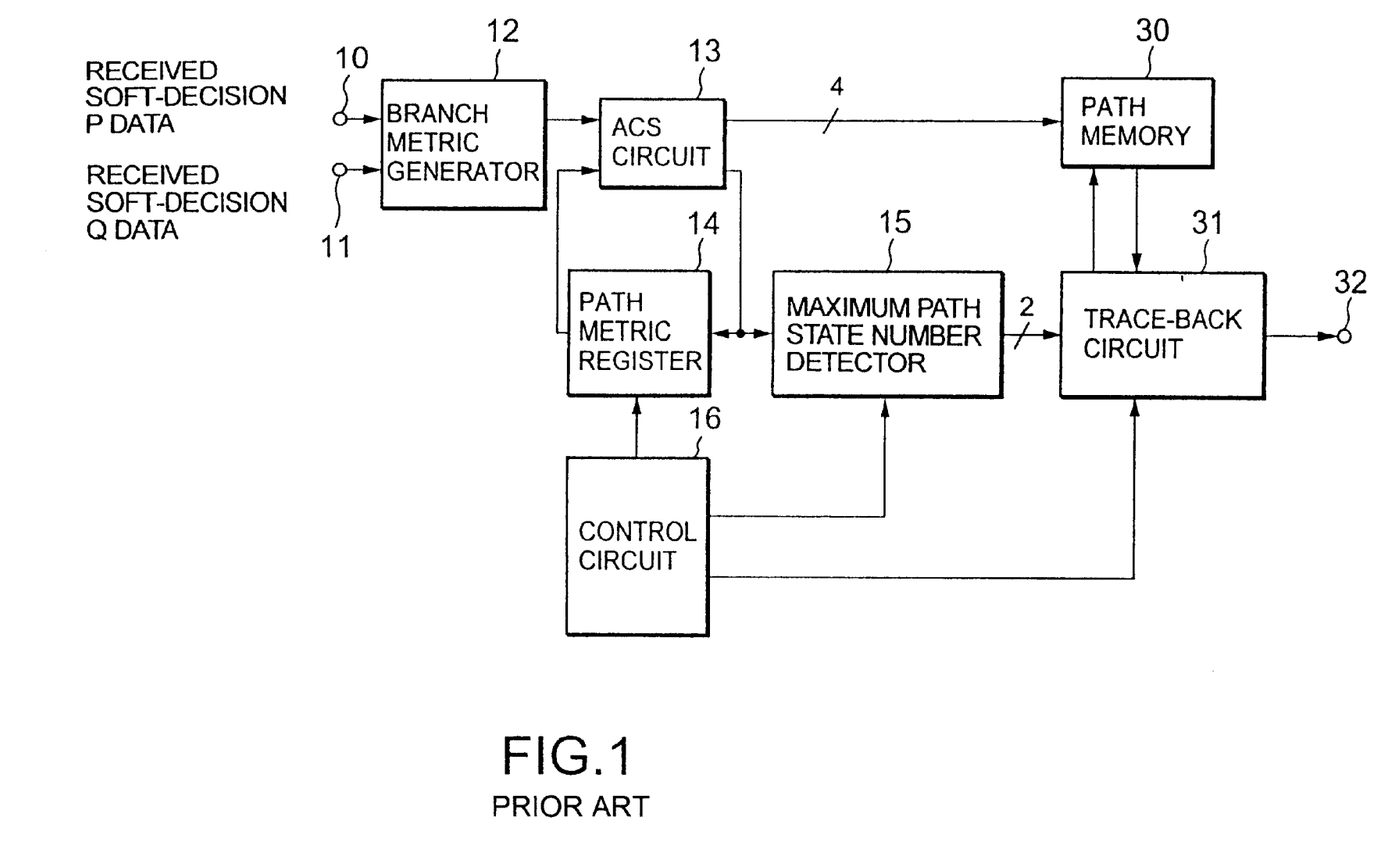
FIG. 1 is a block diagram of a conventional Viterbi decoding apparatus.

Referring to FIG. 1, a conventional Viterbi decoding apparatus will be described at first in order to facilitate an understanding of this invention. The illustrated apparatus uses a trace-back method. The path-selecting information corresponding to 0 state, 1 state, 2 state and 3 state that is output from an ACS circuit 13 from m1 time to m12 time is stored in path memory 30. Assuming that "12" represents the length up to termination of survivor paths, i.e., the length of the path memory, at an m12 time a control circuit 16 performs a control for starting the operation of trace-back. The trace-back is started according to an m12 time maximum path state number that is an output from a maximum path state number detector 15.

First, a trace-back circuit 31 selects from an m12 time path-selecting information stored in the address "11" a bit corresponding to an m12 time maximum path state number. The trace-back circuit 31 determines according to this bit and the m12 time maximum path state number the state number of a next destination with respect to that trace-back is retroactively made next.

Once again, the trace-back circuit 31 reads out from the path memory 30 an m11 time path-selecting information stored in the address 10 thereof and the circuit 31 selects out a bit corresponding to the state number that has been determined at the m12 time. The trace-back circuit 31 repeatedly performs this processing until the circuit 31 reads out an m1 time path-selecting information. And the trace-back circuit 31 outputs a bit obtained the last, from an output terminal 32 as a decoded bit.

Namely, the decoding apparatus stores into the path memory 30 the output of the ACS circuit 13 obtained at an mk time (the k represents an integer of 12 or more). Then, the trace-back circuit 31 starts to make a trace-back according to a maximum path state number corresponding to the mk time. Trace-back is made from the address of the path memory 30 having stored therein an ink path-selecting information retroactively to the past by the extent corresponding to a (k–1) address every symbol time. And the trace-back circuit 31 outputs the bit obtained the last, from the output terminal 32 as a decoded bit. The Viterbi decoding apparatus repeatedly performs this operation.

However, the operation of tracing the path memory back to the past every symbol time is performed in the conventional Viterbi decoding apparatus. As a result, the trace-back operation needs a larger amount of time therefor. Therefore, the apparatus has the problem that the decoding period of time becomes resultantly long.

Figure 2:
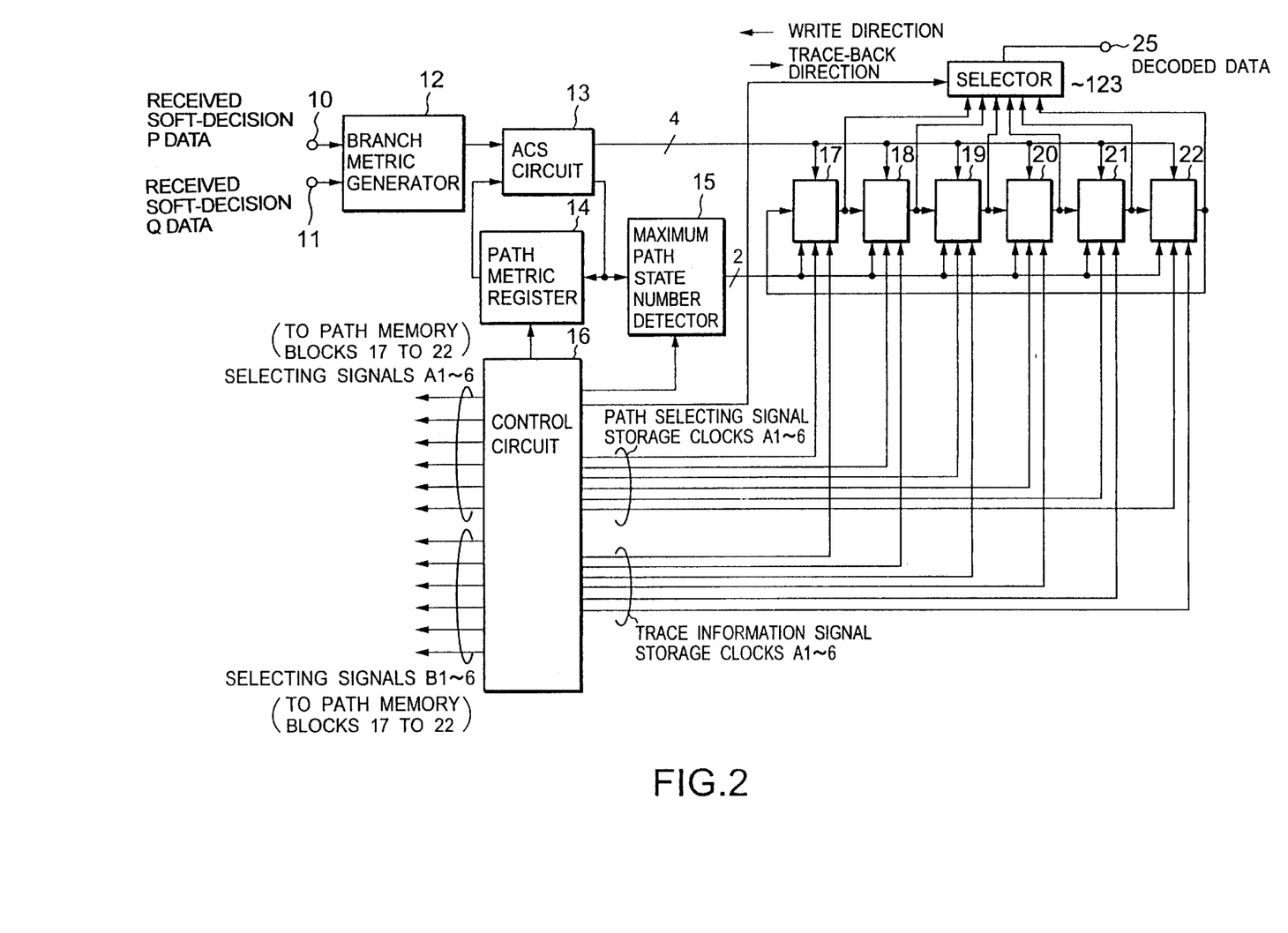
FIG. 2 is a block diagram of a Vertibi decoding apparatus of a preferred embodiment according to the present invention.

Referring to FIG. 2, description will proceed to a Viterbi decoding apparatus of a preferred embodiment of this invention. The illustrated Viterbi decoding apparatus comprises input terminals 10 and 11 that input thereto received P data and received Q data, a branch metric generator 12 that inputs thereto the received P data and received Q data, a path metric register 14 in which a cumulative metric of survivor paths is stored, an ACS circuit 13 that adds (Add), compares (Compare), and selects (Select) the output of the branch metric generator 12 and the output of the path metric register 14 according to the trellis diagram every symbol time and that outputs an n-state path metric value and n-state selecting information, which have been selected by comparison, a maximum path state number detector 15 that determines the greatest path metric value from among the output n-state path metric values of the ACS circuit 13 to thereby determine a state number having the greatest path metric value, and a plurality of path memory blocks 17, 18, 19, 20, 21, and 22 each of which stores the output n-state path-selecting information of the ACS circuit 13 therein every symbol time. Further, the plurality of path memory blocks are each connected to another so that, when trace-back is made, the results of the trace-back may become a starting point for starting the trace-back of a next path memory block. Therefore, each path memory block has a structure enabling the start of the trace-back from any given path memory block. To a selector 23 there is input the output of each path memory block. The output of the selector 23 is output from an output terminal 25 as decoded data. A control circuit 16 controls the path metric register 14, the maximum path state number detector 15, the path memory blocks 17, 18, 19, 20, 21, and 22, and the selector 23.

Figure 3:
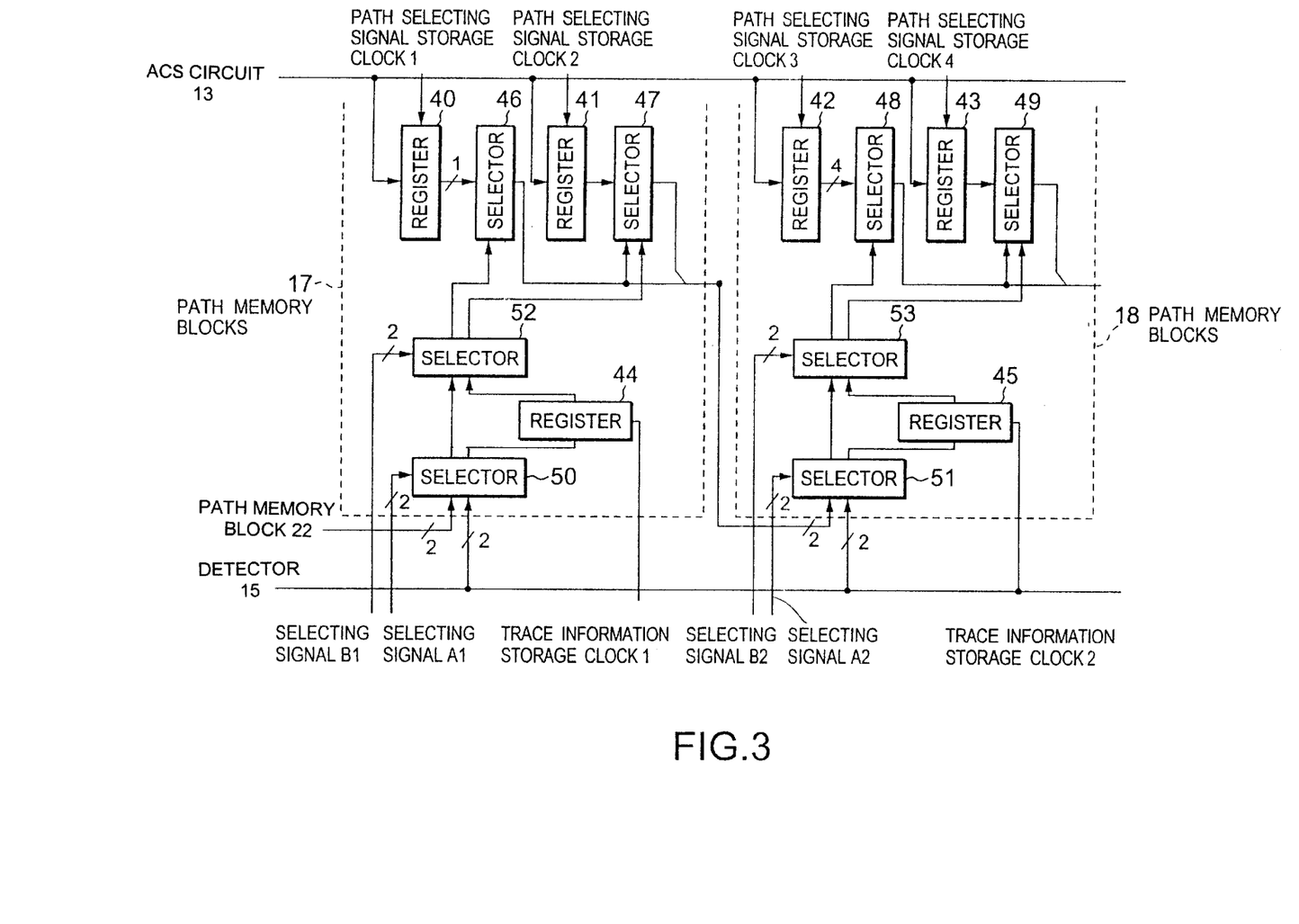
FIG. 3 is a block diagram of path memory blocks illustrated in FIG. 2.

FIG. 3 shows a view of the internal structures of the path memory blocks 17 and 18. The remaining path memory blocks 19, 20, 21, and 22 also have the same internal structure as in the case of the blocks 17 and 18.

The path memory blocks 17 and 18 are equipped with registers 40/41 42/43 for storing therein the output of the ACS circuit 13, respectively. Which register the output information is to be stored in is determined according to path-selecting signal storage clocks 1, 2, 3, and 4 that are output from the control circuit 16. Further, as illustrated, the path memory blocks 17 and 18 have selectors 46, 47, 48 and 49 that the outputs of the registers 40, 41, 42, and 43 are respectively input to. The outputs of the selectors 46 and 47 are connected to the next stage path memory block 18 while on the other hand the outputs of the selectors 48 and 49 are connected to the next stage path memory block 19.

The selector 50 switches the output of the preceding stage path memory block 22 and the output of the maximum path state number detector 15, and the selector 51 switches the preceding path memory block 17 and the maximum path state number detector 15. Registers 44 and 45 store therein the outputs of the selectors 50 and 51, respectively. At this time, the registers 44 and 45 are controlled by trace information storage clocks 1 and 2 output from the control circuit 16. The selector 52 switches the selector 50 and the register 44. Similarly, the selector 53 switches the selector 51 and the register 45. The output of the selector 52 is output to the selector 46 and part of it is output to the selector 47. Also, to the selector 47 there is input from the selector 46. Similarly, the output of the selector 53 is output to the selector 48 and part of it is output to the selector 49. Also, to the selector 49 there is input from the selector 48.

The selectors 50 and 51 are controlled by selecting signals A1 and A2 from the control circuit 16, and the selectors 52 and 53 are controlled by selecting signals B1 and B2 from the control circuit 16.

The operation of the Viterbi decoding apparatus illustrated in FIG. 2 will hereinafter be explained. It is to be noted that, here, it is assumed that the convolutional coding apparatus 33 be the one having a coding rate R of R=½ and a constraint length K of K=3.

Figure 4:
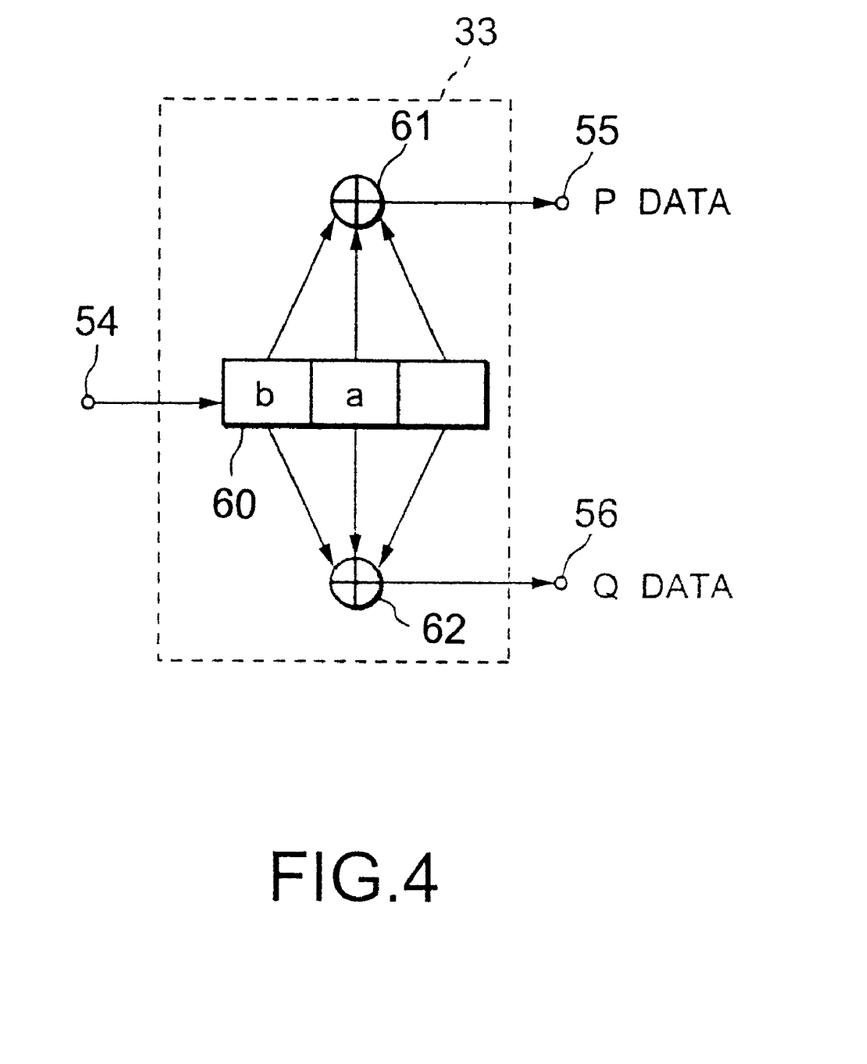
FIG. 4 shows a view of an example of a convolutional coding apparatus.

First, the coding apparatus on the side of the transmission will be explained. On the transmission side, first, as illustrated in FIG. 4, input data is input via an input terminal 54. The input data is coded by the convolutional coding apparatus 33 comprised of a three-stage shift register 60 and exclusive OR gates 61 and 62. The input data is input from the input terminal 54 to the shift register 60 every symbol time. And the output of each designated stage shift register of the shift register 60 is logical-processed by the exclusive OR gates 61 and 62. Thereafter, the outputs of the exclusive OR gates 61 and 62 are output from output terminals 55 and 56 as P data after the fashion of P1, P2,—and as Q data after the fashion of Q1, Q2,—.

Figure 8:
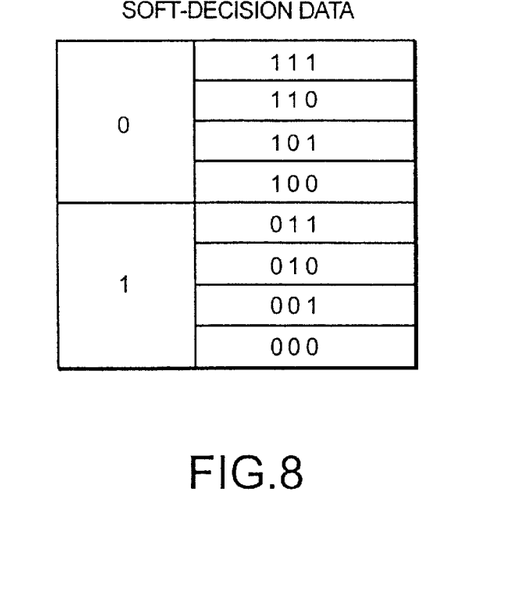
FIG. 8 shows a view of relationship of 3-bit soft-decision data to data 0 and 1.
Figure 9:
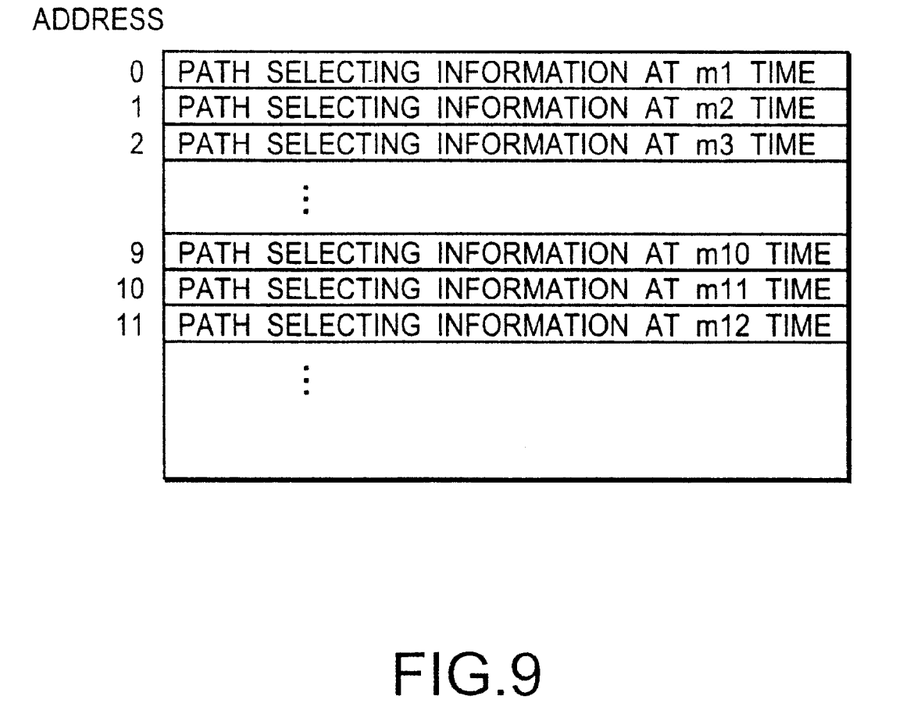
FIG. 9 shows a view of path-selecting information stored in the path memory.

The P data and Q data that are the outputs of the convolutional coding apparatus 33 are input to the branch metric generator 12 via the input terminals 10 and 11. At this time, in order to transmit to the Viterbi decoding apparatus in what fashion the P data and Q data have been changed due to the noises generated in the transmission path, the P data and the Q data are soft-determined in terms of the fashion of change. And the P data and Q data are represented as soft-decision data. In FIG. 8 there is illustrated a soft-decision representation made in the form of 3 bits with respect to 0 and 1.

Figure 6:
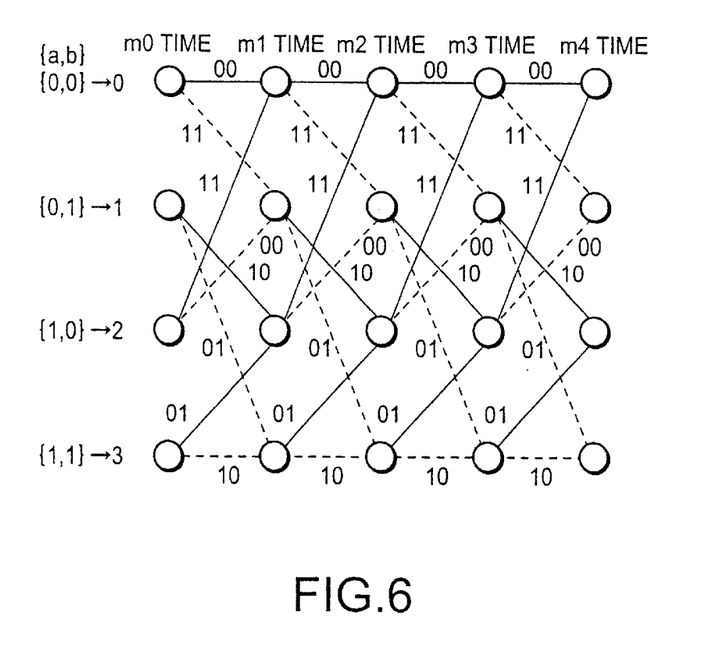
FIG. 6 shows a view of trellis representation of the convolutional coding apparatus illustrated in FIG. 4.

Next, the operation of the Viterbi decoding apparatus will be explained. FIG. 6 shows a view wherein the convolutional coding apparatus 33 is trellis-represented. The {0, 0}, {0, 1}, {1, 0}, and {1, 1} on the left side are each a representation of the contents of the initial stage and the second stage shift register. The values situated laterally of the arrows situated on the right side of the {0, 0}, {0, 1}, {1, 0}, and {1, 1} represents the values each obtained by calculation of (ax2+b). These values are each hereinafter called "a state number".

Briefly explaining about FIG. 6, when the state number is 0, in a case where the data that is input next to the convolutional coding apparatus 33 is "0", transition is made from the state number 0 to the state number 0. As a result of this, the coding apparatus outputs an output value "00" (the value shown above the arrow indicating the transition from the state number 0 to the state number 0) of the P data and Q data. In a case where the data that is input is "0", transition is made from the state number 0 to the state number 1. As a result of this, the coding apparatus output an output value "11" of the P data and Q data. When the state number is another, also, the transit destination is determined according to the data input to the convolutional coding apparatus 33. And the output value of the P data and Q data that is to be obtained at that time is written above the arrow indicating that the transit destination. The Viterbi decoding apparatus performs decoding processing according to this trellis representation.

When the received soft-decision P data and Q data are input to the branch metric generator 12 through the input terminals 10 and 11, the branch metric generator 12 performs the following calculation with respect to (the soft-decision P1 data and the soft-decision Q1 data). Namely, assuming the sets (P, Q) of transmission data at that time be (0, 0), (1, 0), (0, 1), and (1, 1) respectively, the branch metric generator 12 calculates the likelihood of correctness of the received soft-decision P1 data and Q1 data, i.e., the branch metric. When the set of transmission data is (0, 0) with respect to (the soft-decision P1 data and the soft-decision Q1 data), it is assumed that the branch metric be $\lambda 0$. When the set of transmission data is (1, 0) with respect to (the soft-decision P1 and the soft-decision Q1). It is assumed that the branch metric be $\lambda 1$. When the set of transmission data is (0, 1) with respect to (the soft-decision P1 data and the soft-decision Q1 data), it is assumed that the branch metric be $\lambda 2$. When the set of transmission data is (1, 1) with respect to (the soft-decision P1 data and the soft-decision Q1 data), it is assumed that the branch metric be $\lambda 3$. Then, the branch metric generator 12 outputs the $\lambda 0$, $\lambda 1$, $\lambda 2$, and $\lambda 3$ to the ACS circuit 13.

Figure 7:
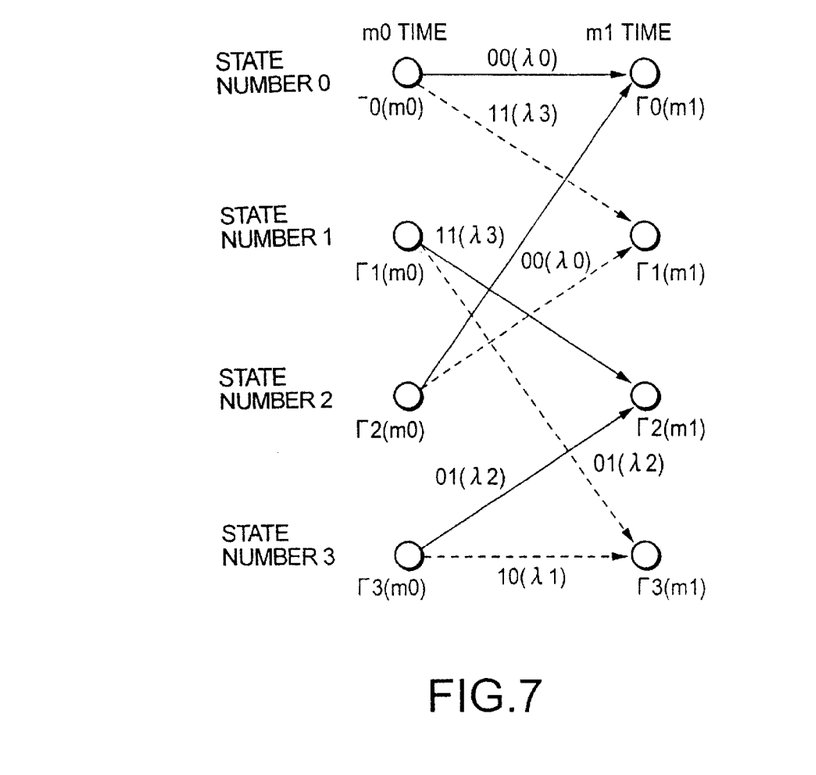
FIG. 7 shows an explanatory view of a construction of an ACS circuit.

At this time, as illustrated in FIG. 7, it is assumed that the path metric values corresponding to the respective state numbers at an m0 time be $\Gamma 0(m0)$, $\Gamma 1(m0)$, $\Gamma 2(m0)$, and $\Gamma 3(m0)$, respectively. The path metric register 14 outputs the $\Gamma 0(m0)$, $\Gamma 1(m0)$, $\Gamma 2(m0)$, and $\Gamma 3(m0)$ to the ACS circuit 13.

The ACS circuit 13 performs its calculation according to the trellis represented illustrated in FIG. 7. Namely, the data that has been transited to the location "state number 0" at an m1 time is the one that has been transited both from the location "number state 0" and from the location "state number 2". The output data that is output from the convolutional coding apparatus when transition is made from the location "state number 0" is "00". Therefore, the branch metric at this time is $\lambda 0$. The output data that is output from the convolutional coding apparatus when transition is made from the location "state number 2" is "11". Therefore, the branch metric at this time is $\lambda 3$. On the other hand, since the path metric values corresponding to the state number 0 and state number 2 at an m0 time are $\lambda 0(m0)$ and $\lambda 2(m0)$, the ACS circuit 13 performs a calculation of $\lambda 0(m0)+\lambda 0$ and $\lambda 2(m0)+\lambda 3$. And the ACS circuit 13 stores a larger one of the calculated values into the path metric register 14 as a path metric value $\lambda 0(m1)$ corresponding to the state number 0 at the m1 time. Simultaneously, a branch value (in a case where one of the values indicated in the solid lines in FIG. 7 is selected, the branch value is "0". In a case where one of the values indicated in the broken lines in FIG. 7 is selected, the branch value is "1".) of the selected value is stored into a register within the path memory block designated by the control circuit 16 as the branch value S0(m1) corresponding to the state number 0 at the m1 time.

Thereafter, the ACS circuit 13 similarly determines the path metric values $\lambda 1(m1)$, $\lambda 2(m1)$, and $\lambda 3(m1)$ at the m1 time and also similarly determines the branch values S1(m1), S2(m1), and S3(m1). And the ACS circuit 13 stores each of those path metric values into the path metric register 14 and stores each of those branch values into the path memory block designated by the control circuit 16.

It is to be noted that, in this example, the path memory of each path memory block is made up of two stages. Since in the example the length of the entire path memory is set to be 12, the entire path memory is constructed using 6 path memory blocks.

The outputs of the ACS circuit 13 at the m1 and m2 times are stored in the register within the path memory block 22; the outputs of the ACS circuit 13 at the m3 and m4 times are stored in the register within the path memory block 21; the outputs of the ACS circuit 13 at the m5 and m6 times are stored in the register within the path memory block 20; the outputs of the ACS circuit 13 at the m7 and m8 times are stored in the register within the path memory block 19; the outputs of the ACS circuit 13 at the m9 and m10 times are stored in the register within the path memory block 18; the outputs of the ACS circuit 13 at the m11 and m12 times are stored in the register within the path memory block 17; and the outputs of the ACS circuit 13 at the m13 and m14 times are sorted in the register within the path memory block 22. Thereafter, this storing operation is repeated in this way.

Figure 5:
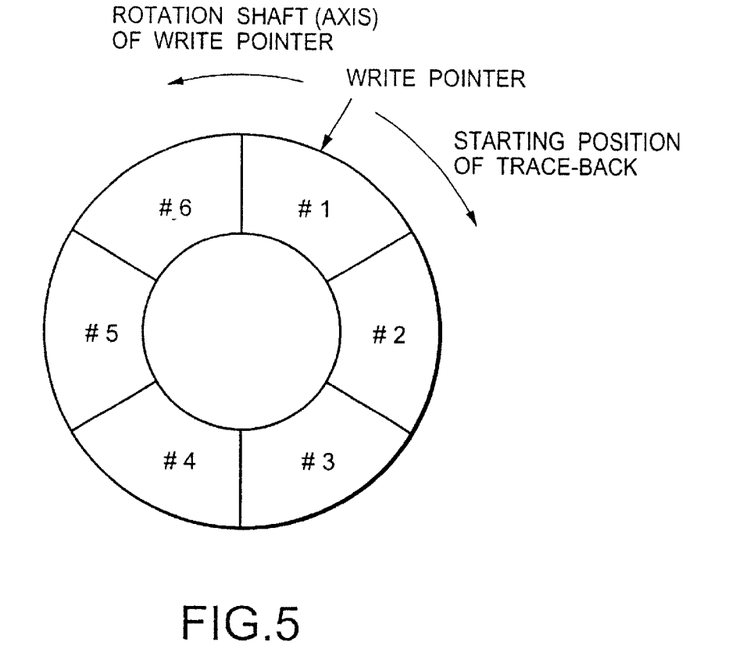
FIG. 5 shows a conceptional view of a ring memory consisting of path memory blocks.

FIG. 5 shows a conceptional view illustrating a ring memory comprised of path memory blocks. The path-selecting information output from the ACS circuit 13 is sorted into the register of the path memory block a write pointer has pointed. Then, the write pointer rotates block by block every two symbol times in the leftward direction. Trace-back is started every two symbol times from the position the write pointer points in the rightward direction.

Also, the ACS circuit 13 outputs the path metric values $\lambda 0(m1)$, $\lambda 1(m1)$, $\lambda 2(m1)$, and $\lambda 3(m1)$ at the m1 time the ACS circuit 13 has determined to the path metric register 14, and also simultaneously outputs these values to the maximum path state number detector 15. At this time, a series of pieces of processing that correspond to the m1 time is ended (hereinafter called "an ACS processing"). When next soft-decision P2 data and Q2 data are input, the ACS circuit 13 repeatedly executes the ACS processing that has been explained above.

Upon termination of the processing corresponding to the m12 time, the control circuit 16 performs the following control. Namely, the maximum path state number detector 15 selects the state number having the greatest path metric value from among the state numbers having the maximum path metric values $\lambda 0(m12)$, $\lambda 1(m12)$, $\lambda 2(m12)$, and $\lambda 3(m12)$. The detector 15 sends that state number to the path memory blocks 17, 18, 19, 20, 21, and 22. And the control circuit 16 controls selecting signals A1, A2, A3, A4, A5, and A6 and selecting signals B1, B2, B3, B4, B5, and B6 so that the maximum state number corresponding to the m12 time may become valid only in the path memory block 17. Namely, the control circuit 16 sets the selecting signals A1 so that the selector 50 within the path memory block 17 may select the maximum state number, and sets the selecting signal B1 so that the selector 52 may select the output of the selector 50.

Also, the control circuit 16 sets the selecting signal A2 so that the selector 51 within the path memory block 18 may select the output of the path memory block 17, and sets the selecting signal B2 so that the selector 53 may select the output of the selector 51. The settings of the selecting signals A3, A4, A5, and A6 and selecting signals B3, B4, B5, and B6 with respect to the path memory blocks 19, 20, 21, and 22 are the same as in the case of the selecting signals A2 and B2. Trace-back at the m12 time is started. As a result of this, the selector 46 selects 1-bit data from a 4-bit output of the register 40 according to the maximum state number corresponding to the m12 time. The selector 47 selects 1-bit data from the 4-bit output of the register 41 according to the MSB of the output of the selector 52 and also to the output bit of the selector 46.

The 2-bit data that is the outputs of the selector 46 and the selector 47 is input to the next stage path memory block 18 and then is input to the selector 48. The selector 48 selects 1-bit data from the 4-bit output of the register 42 according to the output values of the selector 46 and selectors 47. The selector 49 selects 1-bit data from the 4-bit output of the register 43 according to the output value of the selector 53 and the output bit value of the selector 48. The 2-bit data that is the output data of the selector 48 and selector 49 is input to the next-stage path memory block 19.

Thereafter, the same operation is repeated up to the path memory block 22. The respective outputs of the path memory blocks 17, 18, 19, 20, 21, and 22 are connected to the selector 23. The control circuit 16 sets the selector 23 so that at the m12 time the output of the path memory block 22 may be selected. The output of the selector 23 corresponding to the m12 time is output from the output terminal 25 as decoded data.

Thereafter, the same operation is repeated. Namely, at the point in m13 time, the output from the ACS circuit 13 is stored into the register within the path memory block 22 (no trace-back is performed). At this point in m14 time, the output from the ACS circuit 13 is stored into the register within the path memory block 22, after which the maximum state number corresponding to the m14 time is input to the path memory block 22. As a result of this, trace-back is started. At this time, as the trace-back direction, trace-back is retroactively performed after the fashion of the path memory blocks 22, 17, 18, 19, 20, and 21. And the output of the path memory block 21 is output from the selector 23 and this output data is output from the output terminal 25 as decoded data.

In the above-described example, an explanation has been given of the convolutional coding wherein R=½ and the constrained length K=3. However, generally, when the number of register stages within each path memory block is provided (K−1) stages in number, the construction of each of the path memory circuit and trace-back circuit becomes more simplified.

Since in the above-described example the K=3, the path memory block has been constructed using (3−1)=2 stages of register.

Also, it is possible that, owing to the increase in transmission speed, the length of the 1 symbol time becomes small, or the constrained length becomes length with the result that the required length of the path memory becomes large. Even in a case where trace-back from its starting point to its terminating point becomes impossible to execute within the 1-symbol-time length for that reason, trace-back can be executed from its starting point to its terminating point within a several-symbol-time length. Namely, this can be realized by providing a register or registers for storing therein the maximum path state number or trace information from the preceding-stage path memory block.

As described above, in the illustrated example, each path memory block is made up of a register (in case of the path memory block 17 the register 40 or 41) that is a flip-flop type memory element. The output from the ACS circuit 13 is stored into the register of one of the designated path memory blocks 17, 18, 19, 20, 21, and 22 every symbol time input from the input terminals 11 and 12. Each path memory block is connected to one another so that, when trace-back is made, the result of the trace-back of one path memory block may become the starting-point for starting the trace-back of a next path memory block. As a result of this, each path memory block has a structure wherein trace-back can be started from any given path memory block. For example, assuming that the pack memory block 17 be the one from which trace-back is started, trace-back can be performed within the 1 symbol time after the fashion of the path memory blocks 17, 18, 19, 20, 21, and 22. In a case where trace-back of the path memory block 17, 18, 19, 20, 21, and 22 is not complete within the 1 symbol time, into the register (in case of the path memory block 17 the register 44) within a relevant path memory block there is once stored the trace-back information from the preceding-stage path memory block. And, at the next symbol time, trace-back can be thereby started from the relevant path memory block. Accordingly, even with the use of the trace-back method, it is possible to shorten the decoding length of time.

As has been explained above, according to the present invention, there are the advantages that the Viterbi decoding time length can be shortened and that, therefore, the power consumption can be reduced.

What is claimed is:

1. A Viterbi decoding apparatus for processing received P data and received Q data by a trace-back method to obtain decoded data, said received P data and said received Q data being obtained by carrying out convolutional coding of data which are received by a receiver, said Viterbi decoding apparatus comprising:

branch metric producing means for computing a branch metric in accordance with said received P data and said received Q data;

path metric register means for storing a cumulative metric of survivor paths;

ACS circuit means for adding said branch metric entering that state to said cumulative metric of the connecting survivor for all the paths entering a state, comparing, selecting the largest metric for each state (in the case constraint length equals to K, the number of the states is the (k−1)th power of 2), outputting path-selecting information of each state every symbol time, and storing the selecting metric for each state as the cumulative metric(path metric) of the next proceding time unit;

maximum path state number detector means for getting the state number to check the largest path metric among said the states;

a plurality of path memory blocks for storing said path-selecting information of each state every symbol time, said path memory blocks being connected to one another so that a result of trace-back may become a starting point for starting said trace-back of a next path memory block when said trace-back is made, wherein each of said path memory blocks comprises a selecting-information register for storing state selecting information therein, said selecting-information register being a flip-flop type memory element; and selector means for selecting outputs of said path memory blocks to produce said decoded data.

2. A Viterbi decoding apparatus as claimed in claim 1, wherein:

said path memory blocks are connected in series to one another; and output of a final stage one of said path memory blocks being fed back to an initial stage one of said path memory blocks.

3. A Viterbi decoding apparatus as claimed in claim 2, wherein:

said path memory block comprises a plurality of said selecting-information registers; and a selecting-information selector that is equipped every selecting-information register, said selecting-information selector receiving output of said selecting-information register; and output of a preceding stage selecting-information selector being supplied to a next stage selecting-information selector, outputs of the selecting-information selectors being supplied to a next stage one of the path memory blocks.

4. A Viterbi decoding apparatus as claimed in claim 3, wherein:

each of the path memory block comprises:

a first selector for selectively swinging an output of said preceding stage path memory block and an output of said maximum path state number detector;

a first register for storing an output of said first selector therein; and a second selector for selectively switching an output of said first selector and an output of said first register;

an output of said second selector being given to said selecting-information selector.

5. A Viterbi decoding apparatus as claimed in claim 4, further comprising control means for controlling said first and the second selectors.

* * * * *